United States Patent [19]

Kanbayashi

[11] 4,312,011
[45] Jan. 19, 1982

[54] DARLINGTON POWER TRANSISTOR

[75] Inventor: Kazuo Kanbayashi, Maebashi, Japan

[73] Assignee: Hitachi, Ltd., Tokyo, Japan

[21] Appl. No.: 10,995

[22] Filed: Feb. 9, 1979

[51] Int. Cl.³ ............... H01L 27/02; H01L 29/34; H01L 29/40

[52] U.S. Cl. .................. 357/46; 357/52; 357/53

[58] Field of Search .................. 357/46, 52, 53

[56] References Cited

U.S. PATENT DOCUMENTS

| 3,573,571 | 4/1971 | Brown | 357/53 |
| 3,596,150 | 7/1971 | Berthold et al. | 357/46 |
| 3,600,648 | 8/1971 | Longo | 357/53 |

*Primary Examiner*—Gene M. Munson
*Attorney, Agent, or Firm*—Craig & Antonelli

[57] ABSTRACT

This invention relates to a Darlington power transistor which executes a stable operation and which demonstrates satisfactory characteristics, characterized in that respective base regions of a driving transistor and an output transistor to be Darlington-connected, and a semiconductor resistance region having the same conductivity type as that of both the base regions and serving to connect both said base regions are formed in a surface of a first conductivity type semiconductor substrate serving as a common collector region; and that a semiconductor region having the same conductivity type as that of said semiconductor substrate and an impurity concentration higher than that of said semiconductor substrate is formed in the semiconductor substrate surface between at least one of said base regions and said semiconductor resistance region and at a position apart from said at least one base region and said semiconductor resistance region.

8 Claims, 8 Drawing Figures

4,312,011

DARLINGTON POWER TRANSISTOR

BACKGROUND OF THE INVENTION

This invention relates to a Darlington power transistor, and more particularly to a p-n-p type Darlington power transistor.

In case of putting transistors of the same conductivity type into the Darlington connection, their collectors are connected in common. Accordingly, two or more transistors to be Darlington-connected can be fabricated in a semi-conductor substrate which serves as the common collectors. A driving transistor, namely, a transistor at the preceding stage amplifies an input current and drives an output transistor, namely, a transistor at the succeeding stage. Such a multiple transistor drives a load satisfactorily with a comparatively small input current. In this invention, the multiple transistor as above described shall be termed the "Darlington power transistor".

In the Darlington power transistor, a base region of the driving transistor and a base region of the output transistor are formed in the semiconductor substrate as the common collectors, and the emitter of the driving transistor and the base of the output transistor are connected by an interconnection or the like.

Breeder resistances are connected to the respective bases of the driving transistor and the output transistor in order that even when an undersirable leakage current has arisen in the transistor of the preceding stage the transistor of the succeeding stage may not respond to the leakage current and that the operation may be stabilized.

The breeder resistance for the driving transistor can be constructed by, for example, a semiconductor resistance region which is made simultaneously with the base regions of the driving transistor and the output transistor and which is elongate in a manner to continually extend between the base regions. For the breeder resistance for the output transistor, the spreading resistance of the base region can be utilized by short-circuiting a part of the base-emitter junction of the output transistor by means of an emitter electrode.

In order to stabilize electrical characteristics, the surfaces of the base, emitter and collector regions of the Darlington power transistor are covered with a protective film such as silicon oxide film.

The Darlington power transistor has been expected to execute a stable and favorable operation owing to the adoption of the breeder resistances as stated above.

According to experiments, however, the operation was unstable particularly in a p-n-p type Darlington power transistor, and characteristics such as current gain did not demonstrate satisfactory values.

It has been revealed by the inventor's study that, in spite of the adoption of the breeder resistances as stated previously, channels causing channel currents which are not negligible are formed between the base regions of the output transistor and in the surface of the semiconductor substrate in the vicinity of the semiconductor resistance region.

SUMMARY OF THE INVENTION

It is accordingly an object of this invention to provide a Darlington power transistor which conducts a stable operation and which demonstrates satisfactory characteristics.

Another object of this invention is to provide a Darlington power transistor which can satisfactorily intercept the channel between a driving transistor and an output transistor.

Another object of this invention is to provide a Darlington power transistor which is easily manufactured.

In accordance with this invention, a channel is intercepted by a semiconductor region at a high impurity concentration which is formed in a semiconductor substrate.

A conductor layer is formed on the surface of a semiconductor substrate through an insulating film, and is held at the same potential as that of the semiconductor substrate. A channel is intercepted by this conductor layer.

According to an improvement of this invention, the semiconductor region at the high impurity concentration and the conductor layer at the substrate potential are effectively combined.

Hereunder, this invention will be concretely described in conjunction with embodiments.

DESCRIPTION OF THE PREFERRED EMBODIMENTS

Figure 1:
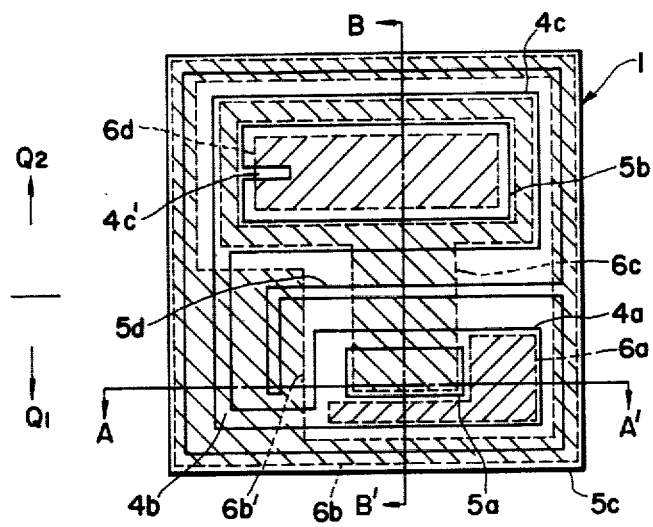
FIG. 1 is a plan view of a Darlington power transistor showing an embodiment of this invention.
Figure 2:
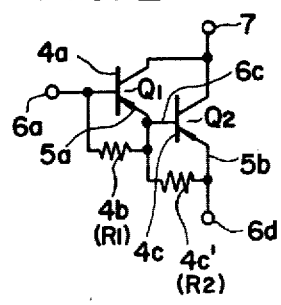
FIG. 2 is a diagram of the equivalent circuit of the Darlington power transistor in FIG. 1, FIGS. 3(a) to 3(c) are sectional views of manufacturing steps taken along line A—A' in FIG. 1.

In FIG. 1, solid lines indicate patterns of semiconductor regions, and broken lines indicate patterns of electrodes and interconnections made of aluminum or the like.

Referring to the figure, a $p^+$-type region (5c) as an annular is disposed over the whole periphery of the surface of a $p^-$-type semiconductor substrate (1) in the vicinities of the side faces thereof. In the surface of the semiconductor substrate (1) surrounded by the $p^+$-type region (5c), there are disposed an n-type region (4a) which forms the base of a driving transistor ($Q_1$), an n-type region (4c) which forms the base of an output transistor ($Q_2$), and an n-type region (4b) which is continuous to the n-type regions (4a) and (4c) and which forms a breeder resistance ($R_1$) of the driving transistor ($Q_1$).

A $p^+$-type region (5a) which forms an emitter region is disposed in the base region (4a) of the driving transistor ($Q_1$). Likewise, a $p^+$-type region (5b) which forms an emitter region is disposed in the base region (4c) of the output transistor ($Q_2$).

In the surface of the semiconductor substrate (1) between the base region (4a) of the driving transistor and the base region (4c) of the output transistor and between the base region (4a) of the driving transistor and the n-type region (4b) as the breeder resistance ($R_1$), a $p^+$-type region (5d) which has the same conductivity type as that of the substrate (1) and an impurity concentration higher than that of the substrate (1) and which functions as a channel stopper is disposed apart from the respective regions (4a, 4b, 4c). Although this is not especially restrictive, the channel stopper (5d) is continuous to the annular (5c) as illustrated. The channel stopper (5d) and the annular (5c) fall into the same potential as that of the semiconductor substrate (1), i.e., the collectors of the transistors.

The channel stopper (5d) and the annular (5c) can be formed by the same manufacturing process as that of the emitters (5a, 5b) of the transistors ($Q_1$, $Q_2$). This will become apparent from the explanation of a manufacturing method to be made later.

A base region (4c') the three sides of which are enclosed with the emitter region of the output transistor forms a breeder resistance ($R_2$) between the emitter and base of the output transistor. The breeder resistance ($R_2$) is constructed by the so-called shorted emitter structure in which the emitter (5b) and the base region (4c') are short-circuited by an emitter electrode (6d). In FIG. 1, leftwardly-lowering oblique lines are applied to the emitter electrode (6d) to clarify the pattern thereof. In the figure, leftwardly-lowering oblique lines are also applied to a base electrode (6a) of the driving transistor ($Q_1$).

Figure 4:
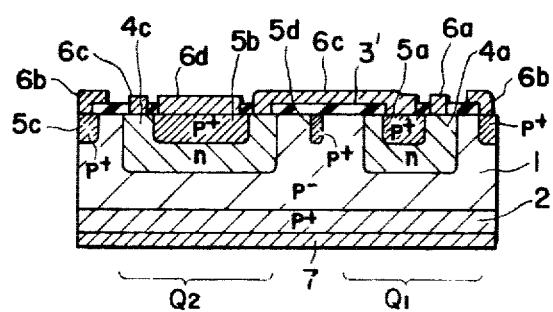
FIG. 4 is a sectional view taken along line B—B' in FIG. 1.

The emitter (5a) of the driving transistor ($Q_1$) and the base (4c) of the output transistor ($Q_2$) are indicated by applying rightwardly-lowering oblique lines thereto in FIG. 1. As shown in FIG. 4, they are electrically connected by an aluminum interconnection (6c) which extends on an oxide film (3').

Figure 3A:
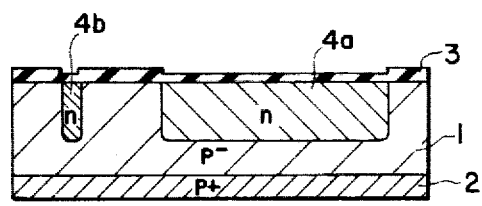
Figure 3B:
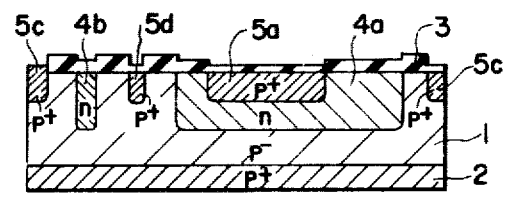
Figure 3C:
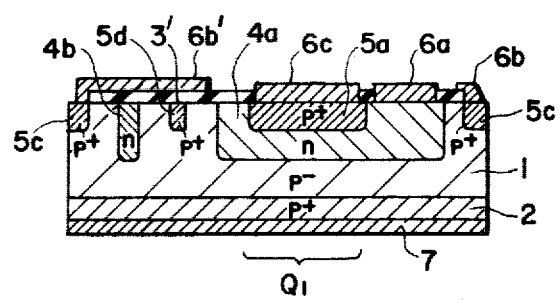

As shown in FIG. 3(c) and FIG. 4, an inversion preventing electrode (6b) which is connected to the annular (5c) and whose inner end extends on the substrate surface is formed on the oxide film (3').

On the surface of the semiconductor substrate (1) corresponding to the n-type resistance region (4b) and the vicinity thereof, an electrode (6b') is formed through the oxide film (3') as shown in FIG. 3(c). This electrode (6b') is continuous to the electrode (6b) which becomes the same potential as that of the substrate (1). The electrode (6b') also extends onto the channel stopper (5d).

By extending the electrode (6b') onto the channel stopper (5d) as stated above, the base region (4a) of the driving transistor ($Q_1$) is enclosed by the combination of the electrodes (6b, 6b') and the channel stopper (5d), and the base region (4c) of the output transistor ($Q_2$) is enclosed by the combination of the electrodes (6b, 6b') and the channel stopper (5d) independently of the base region (4a) of the driving transistor ($Q_1$).

In the above construction, the interconnection (6c) which connects the emitter region (5a) of the driving transistor ($Q_1$) and the base region (4c) of the output transistor ($Q_2$) becomes a positive potential with respect to the semiconductor substrate (1) in the state of use of the transistors.

By this interconnection (6c), therefore, an electric field is applied to the semiconductor substrate (1) in the direction of inducing an inversion channel. In case where the inversion channel has been induced in the whole region under the electrode (6c), the base region (4a) of the driving transistor ($Q_1$) and the base region (4c) of the output transistor ($Q_2$) are connected with each other by the inversion channel.

In the structure of the above embodiment, the channel stopper (5d) is arranged in a manner to cross under the interconnection (6c). Accordingly, even when the inversion channel has been induced in the surface of the semiconductor substrate (1) under the interconnection (6c), it is intercepted by the channel stopper (5d).

Also in a part other than the interconnection (6c), an inversion channel is induced in the surface of the substrate (1) in such a manner that charges leak from the interconnection (6c) or any electrode onto the oxide film (3'). The channel stopper (5d) also acts on such an inversion channel effectively.

The electrode (6b') has the same potential as that of the semiconductor substrate (1), and prevents an inversion channel from being induced in the semiconductor substrate surface underlying this electrode (6b').

Since the channel stopper (5d) is highly doped with an impurity, a structure in which the channel stopper (5d) is held in direct contact with the base region and n-type resistance region of the transistor is unsuitable for attaining a withstand voltage required for the transistor. In case where, as shown in FIG. 1, the base region (4a) of the driving transistor ($Q_1$) and the base region (4c) of the output transistor ($Q_2$) are made continuous by the n-type resistance region (4b), it is difficult to perfectly intercept the channel between the base region (4a) of the driving transistor and the base region (4c) of the output transistor by means of the channel stopper (5d) only.

In the foregoing embodiment, as shown in FIG. 1, the whole peripheries of the base regions of the driving transistor ($Q_1$) and the output transistor ($Q_2$) are respectively surrounded by the combinations of the channel stopper (5d) and the electrodes (6b, 6b'). Accordingly, the interception of the invention channel between the two base regions is more favorable.

Owing to the electrode (6b') at the same potential as that of the substrate (1), no inversion channel is induced in the surface of the semiconductor substrate (1) in the vicinity of the n-type resistance region (4b). In contrast, if the electrode (6b') is not disposed in the vicinity of the resistance region (4b), an inversion channel adjoining the resistance region will, in effect, constitute part of the resistance region to lower the resistance value thereof. In case of the embodiment, the resistance region (4b) maintains a favorable high resistance owing to the adoption of the electrode (6b').

If the electrode (6b') and the channel stopper (5d) as in the embodiment are not used, the base region (4a) of the driving transistor ($Q_1$) and the base region (4c) of the output transistor ($Q_2$) will be connected through the inversion channel induced in the surface of the semiconductor substrate (1). In this case, the base current $I_B$ versus base-emitter voltage $V_{BE}$ characteristic of the driving transistor becomes as indicated by a broken line B in FIG. 5. An input current to the base of the driving transistor ($Q_1$) bypasses to the inversion channel. When the input current is small, most of this input current flows to the inversion channel. When the input current has become great, it flows to the base of the driving transistor for the first time.

Figure 6:
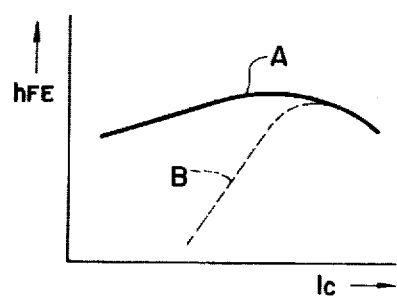
FIG. 6 is a graph showing current gain versus collector current characteristic curves.

On the ground that when the input current is small it is not amplified by the driving transistor ($Q_1$) in substance, the current gain $h_{FE}$ versus collector current $I_C$ characteristic of the Darlington power transistor becomes as indicated by a broken-line curve B in FIG. 6. In the region in which the collector current $I_C$ is small, that is, in the region in which the input current is small, the current gain is conspicuously small.

Figure 5:
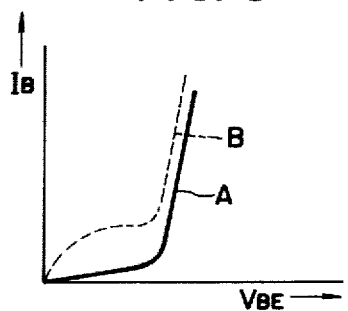
FIG. 5 is a graph showing base current versus base-emitter voltage characteristic curves.

The characteristics of the transistor of the embodiment of this invention are favorable as indicated by solid-line curves A in FIGS. 5 and 6.

Since the channel stopper (5d) and the annular (5c) can be fabricated simultaneously with the formation of the emitter regions of the transistors as stated before and the electrodes and interconnections may be of the single layer, the structure of the embodiment can be manufactured without especially altering a process for manufacturing a transistor which has heretofore been employed.

Now, a method of manufacturing the transistor of the embodiment will be described with reference to sectional views of FIGS. 3(a)-3(c). The sections of these figures are as viewed along line A—A ' in FIG. 1.

A section taken along line B—B' in FIG. 1 is shown in FIG. 4.

First of all, as shown in FIG. 3(a), a p+-type semiconductor region (2) is formed on the lower surface of a p--type silicon semiconductor substrate (1) by, for example, the diffusion of a p-type impurity. Thus, a p+-type collector layer is obtained.

On the other hand, an oxide film (3) is formed on the upper surface by the well-known thermal oxidation. Subsequently, the selected areas of the oxide film (3) which correspond to base forming regions and a resistance forming region are removed by the photoetching. Using the resultant SiO₂ film (3) as a mask, the base diffusion is carried out to form base regions (4a, 4c) and a resistance region (4b) of the n-type.

As shown in FIG. 3(b), the selected areas of the oxide film (3) which correspond to emitter forming regions and annular and channel stopper forming regions are removed by the photoetching. Using the resultant oxide film (3) as a mask, the emitter diffusion is carried out to form emitter regions (5a, 5b) and an annular (5c) as well as a channel stopper (5d) of the p+-type.

As shown in FIG. 3(c), if necessary, the oxide film (3) is removed and a new oxide film (3') is formed, and the selected parts of the oxide (3') at which electrodes and interconnections are to be connected are removed by the photoetching. Subsequently, aluminum is evaporated to form the electrodes and interconnections. A collector electrode (7) is formed on the lower surface.

The surface of a silicon substrate tends to be turned into the n-type by a silicon oxide film which covers this surface. Accordingly, this invention is particularly effective when applied to a p-n-p type Darlington power transistor.

What is claimed is:

1. A Darlington power transistor characterized in that respective base regions of a driving transistor and an output transistor to be Darlington-connected, and a semiconductor resistance region having the same conductivity type as that of both the base regions and serving to connect both said base regions are formed in a surface of a first conductivity type semiconductor substrate serving as a common collector region; and that a semiconductor region having the same conductivity type as that of said semiconductor substrate and an impurity concentration higher than that of said semiconductor substrate is formed in the semiconductor substrate surface between at least one of said base regions and said semiconductor resistance region and at a position apart from said at least one base region and said semiconductor resistance region.

2. A Darlington power transistor as defined in claim 1, wherein said semiconductor region having an impurity concentration higher than that of said semiconductor substrate is a semiconductor region which is formed simultaneously with a step of forming emitters of said driving transistor and said output transistor.

3. A Darlington power transistor as defined in claim 1, wherein said driving transistor and said output transistor are of the p-n-p type.

4. A Darlington power transistor as defined in claim 3, wherein an emitter region of said driving transistor and said base region of said output transistor are connected by a conductor layer whih is formed on the semiconductor substrate surface through an insulating film and which crosses over said semiconductor region having the higher impurity concentration.

5. A Darlington power transistor characterized in that respective base region of a driving transistor and an output transistor to be Darlington-connected, and a semiconductor resistance region having the same conductivity type as that of both the base regions and serving to connect both said base regions are formed in a surface of a first conductivity type semiconductor substrate serving as a common collector region; and that a conductor layer which is made the same potential as that of said semiconductor substrate is formed on the surface of said semiconductor substrate between at least one of said base regions and said semiconductor resistance region, through an insulating film.

6. A Darlington power transistor characterized in that respective base regions of a driving transistor and an output transistor to be Darlington-connected, a semiconductor resistance region having the same conductivity type as that of both the base regions and serving to connect both said base regions, and a semiconductor region located apart from said both base regions and said semiconductor resistance region and having the same conductivity type as that of said semiconductor substrate and an impurity concentration higher than that of said semiconductor substrate are formed in a surface of a first conductivity type semiconductor substrate serving as a common collector region; and that in the surface of said semiconductor substrate, said base region of at least one of said two transistors is surrounded by a combination between said semiconductor region having the higher impurity concentration and a conductor layer which is formed on said semiconductor substrate through an insulating film and which is made the same potential as that of said semiconductor substrate.

7. A Darlington power transistor as defined in claim 6, wherein said conductor layer which is made the same potential as that of said semiconductor substrate is formed on the surface of said semiconductor substrate proximate to said semiconductor resistance region, through the insulating film.

8. A Darlington power transistor as defined in claim 7, wherein said two transistors are of the p-n-p type.

* * * * *